Feb. 9, 1965 J. O. SINNIGER 3,169,228

TRANSISTOR AMPLIFIER WITH DIODE FEEDBACK CIRCUIT

Filed June 26, 1961

INVENTOR.
JOSEPH O. SINNIGER
BY Eugene M. Whitacre
Attorney

United States Patent Office 3,169,228
Patented Feb. 9, 1965

3,169,228

TRANSISTOR AMPLIFIER WITH DIODE FEEDBACK CIRCUIT

Joseph O. Sinniger, Smithtown, N.Y., assignor to Radio Corporation of America, a corporation of Delaware Filed June 26, 1961, Ser. No. 119,592
9 Claims. (Cl. 330—24)

This invention relates to signal translating circuits, and in particular to semiconductor signal translating stages having good low frequency performance.

Circuit configurations have been proposed for increasing the normally low input impedance of semiconductor signal translating stages. Such circuits have not provided good low frequency performance however, and attempts in the direction of improving the low frequency operation have resulted in increased cost and complexity of the circuit.

It is accordingly an object of this invention to provide an improved semiconductor signal translating stage.

A further object of this invention is to provide an improved high input impedance transistor signal translating stage having good low frequency performance characteristics.

Another object of this invention is to provide an improved transistor amplifier circuit having improved low frequency response characteristics.

A semiconductor signal translating stage in accordance with the invention includes a transistor having base, emitter and collector electrodes. An input impedance element is coupled to the base electrode, and through a forward biased diode to the emitter electrode. An emitter impedance element is connected between the emitter electrode and a point of reference potential for the circuit.

Signals applied to one end of the input impedance element are translated in the usual manner and developed across the emitter impedance element. The signals across the emitter impedance element are coupled back through the diode to the other end of the input impedance element. Since the applied signals and the signals fed back through the diode are in phase, the current drawn from the signal source is reduced, thereby effectively increasing the input impedance of the stage.

The diode is biased to a point just above the knee of its characteristic to provide the desirable qualities of a large D.-C. resistance and a relatively low A.-C. resistance. The large D.-C. resistance permits the proper bias to be established without drawing excessive bias currents, while a low A.-C. resistance is presented to provide good feedback from emitter-to-base. The advantage of using a diode for coupling between the emitter electrode circuit and the base electrode circuit, is in the improvement of low frequency operation because the diode A.-C. impedance contains essentially no reactive term, thus eliminating phase shifts and resultant circuit degeneration at low frequencies.

The novel features that are considered characteristic of this invention are set forth with particularity in the appended claims. The invention itself however, both as to its organization and method of operation as well as additional objects and advantages thereof will best be understood from the following description when read in connection with the accompanying drawings, in which:

Figure 1:
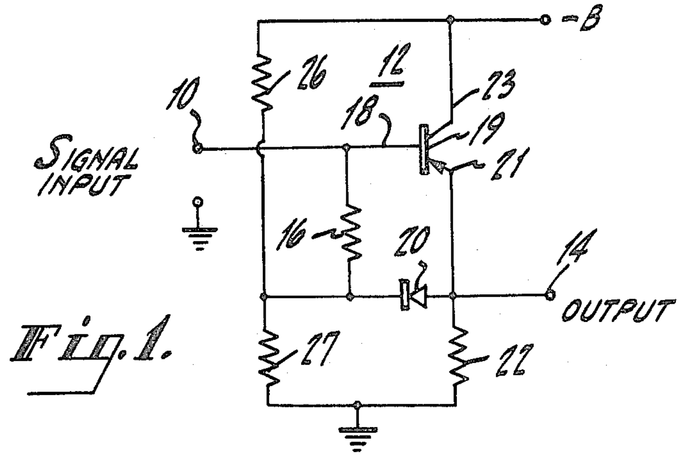
FIGURE 1 is a schematic circuit diagram of a high input impedance emitter follower signal translating stage embodying the invention.

Referring to the drawings, and in particular to FIGURE 1 signals from a suitable source, not shown, are coupled to a pair of input terminals 10 of a semiconductor amplifier 12 for amplification before being applied through an output terminal 14 to a utilization or load circuit, not shown. The input circuit for the amplifier 12 includes a resistor 16 having one end thereof connected to the base electrode 18 of the transistor 19. The emitter electrode is connected to ground through a resistor 22, and the collector electrode 23 is connected to the negative terminal of a source of operating potential (—B).

The bias voltage for the transistor 19 is derived across the diode 20. To this end, the diode 20 is connected to a voltage divider comprising the resistors 26 and 27 which are connected in series across the source of operating potential.

If the transistor is germanium, and a forward bias of about 0.7 volt is desired, then the diode 20 may be a general purpose silicon diode. The value of the resistors 26, 27, 22 and of the voltage from the voltage source may then be adjusted to provide approximately 0.7 volt drop across the diode 20. The 0.7 volt drop is equal to the intrinsic voltage due to the diffusion currents in the diode junction, and is sufficient to maintain diode conduction without disturbing bias currents. If a particular circuit requires a larger base emitter D.-C. voltage drop, then two diodes or more may be connected in series.

In high input impedance semiconductor circuits proposed heretofore, capacitors have been used to feed back signals to the input circuit. In such circuits, the A.-C. impedance at low frequencies produces phase shifts which results in degeneration at low frequencies. Although the capacitor provides the necessary D.-C. isolation to prevent excessive bias circuit currents, attempts in the direction of improving the low frequency response of such amplifiers resulted in bulky and expensive large value capacitors.

Considering the operation of the device, signals applied to the base electrode 18, are translated through the circuit and produce corresponding signals across the emitter resistor 22. The instantaneous phase of the signals at the base electrode 18 and emitter electrode 21 are in phase. Thus the signal voltage appearing at the emitter electrode 21 may be fed back through the diode 20 to the end of the resistor 16 remote from the base electrode 18. Since the applied voltage at the base 18 and that at the bottom of the resistor 16 are in phase, the potential difference across the resistor 16 due to signals is reduced, and, as a consequence, little current flows in the input circuit thereby effectively increasing the input impedance of the stage. If desired, the amplifier can be connected to include an additional impedance element in the collector circuit across which the output signals may be derived.

Figure 3:
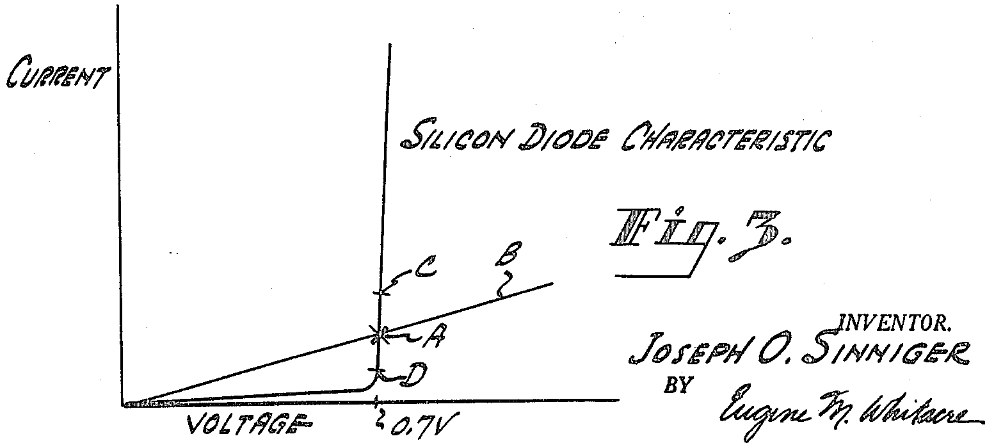
FIGURE 3 is a graph showing the current-voltage relationship of a semiconductor diode which may be used as the emitter-base decoupling element in signal translating circuits embodying the invention.

The characteristic of a general purpose silicon diode is shown in FIGURE 3. Since the diode 20 is forward biased to about 0.7 volt as indicated at point A on its current-voltage curve, it will be seen that the D.-C. resistance, represented by the small slope of line B, is relatively high. It may also be seen from the curve, that the amount of current required to maintain this bias is relatively low, so that the demands on the power supply are reduced. However, for the A.-C. operation of the circuit, it will be seen that the diode operates between points C and D on its current-voltage curve. Since this slope of this portion of the curve is steep, the resistance is relatively low so that good coupling through the diode is achieved for A.-C. signals.

Figure 2:
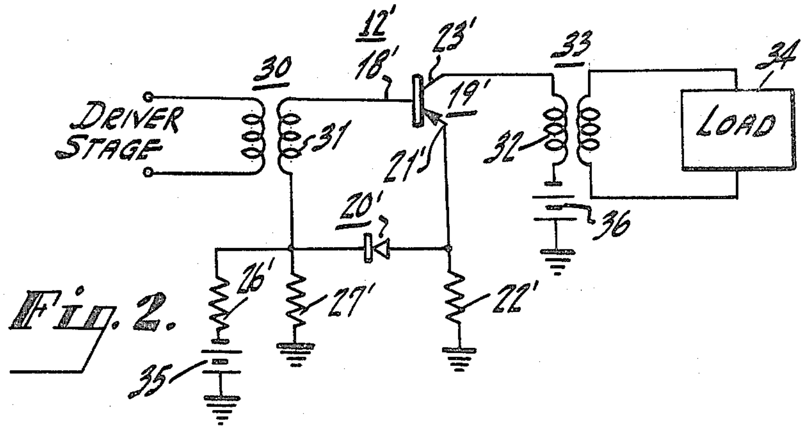
FIGURE 2 is a schematic circuit diagram of a transistor power output stage embodying the invention.

The circuit of FIGURE 2 is similar to that of FIGURE 1. Signals from a suitable suorce, not shown, are coupled through an input transformer 30 to the semiconductor amplifier 12'. The transformer 30 includes a secondary winding 31 connected between the base 18' of the transistor 19' and the diode 20'. Output signals from the amplifier 12' are developed across the primary winding 32 of an output transformer 33 and are coupled to a utilization or load circuit 34. In FIGURE 2 separate batteries 35 and 36 are used for the biasing voltage divider 26' and 27' and for the collector supply. However it is recognized that a single supply source may be used in the manner shown in FIGURE 1, or in any other suitable manner.

The operation of the circuit shown in FIGURE 2 differs from that of FIGURE 1 in that the former is not a high impedance input circuit. The function of the diode 20' of FIGURE 2 is primarily to decouple the biasing resistors 26' and 27' and the emitter resistor 22'. In other words, without the diode 20', which is biased in the manner set forth above with respect to FIGURE 1, the signal applied to the amplifier 12' would be developed across the resistors 26', 27' and 22', leaving less signal to be developed across the emitter 21' base 18' junction. The diode 20' bypasses these resistors for signals of frequencies down to direct current. The circuit described is particularly attractive for high power amplifier stages. Bulky and expensive capacitors have heretofore been used, without providing the enhanced low frequency response achieved in circuits embodying the invention.

From the foregoing it will be seen that in circuits of the invention the diode feedback element provides the desirable characteristics of a large D.-C. resistance and a small A.-C. resistance. In addition, for low frequencies the diode has essentially no reactive term so that there is little or no phase shift and resultant signal degeneration at low frequencies:

I claim:

1. A signal translating circuit comprising a transistor having base, emitter and collector electrodes, an output circuit connected between said emitter and collector electrodes being adapted to receive a source of energizing potential, said output circuit including an impedance element connected between said emitter electrode and a junction point, means including an impedance element for applying an input signal between said base electrode and said junction point, and means for feeding back signals from said emitter electrode to said base electrode comprising a forward biased diode and said last mentioned impedance element connected between said emitter electrode and said base electrode.

2. A signal translating circuit comprising a transistor having base, emitter and collector electrodes, an output circuit connected between said emitter and collector electrodes being adapted to receive a source of energizing potential, said output circuit including a first impedance element connected to said emitter electrode; a diode, a second impedance element, an input circuit having two terminals, one of said terminals being coupled to said base electrode and through said second impedance element and said diode to said emitter electrode, the other of said terminals being connected to said emitter through said first impedance element, and means for applying a biasing potential in a forward direction across said diode to bias said diode to an operating point such that the diode exhibits relatively high direct current resistance and relatively low impedance to the signal current superimposed on said biasing potential for both increasing and decreasing signal currents through said diode.

3. A signal translating circuit comprising a transistor having base, emitter and collector electrodes, an output circuit connected between said emitter and collector electrodes being adapted to receive a source of energizing potential, said output circuit including a first impedance element connected between said emitter electrode and a point of reference potential for said circuit, a diode, a second impedance element, an input circuit including input terminals connected respectively to said point of reference potential and said base electrode, one of said input terminals being connected through said second impedance element and said diode to said emitter electrode and means for biasing said diode in a forward direction to a point beyond the knee of the characteristic curve of current through said diode versus voltage across it and into the high conductance region for both increasing and decreasing signal currents through said diode.

4. A signal translating circuit comprising a transistor having base, emitter and collector electrodes, an input circuit element connected between said base and a point of reference potential, a diode and an impedance element connected in series in the order named between said base electrode and said point of reference potential for said circuit, means connecting said emitter electrode to the junction between said diode and said impedance element, means for applying an operating potential between said collector electrode and said point of reference potential, and means for baising said diode in a forward direction to a point beyond the knee of the characteristic curve of current through said diode versus voltage across it and into the high conductance region for both increasing and decreasing signal components of current through said diode.

5. A signal translating circuit comprising a transistor having base, emitter and collector electrodes, an input circuit for applying signals to be translated to said transistor, said input circuit including an impedance element having a first terminal coupled to said base electrode, output circuit means connected between said emitter and collector electrodes being adapted to receive a source of energizing potential including a resistor connected between said emitter electrode and a point of reference potential for said circuit so that at least a portion of the signals translated by said transistor is developed across said resistor, a diode having one electrode connected to the junction of said emitter electrode and said resistor and the other electrode connected to a second terminal of said input impedance element, and means for applying a biasing potential to said diode in the forward direction so that said diode exhibits a relatively high direct current resistance to the direct current component of said potentials and a relatively low alternating current resistance to the signal component of said potentials applied to said diode.

6. A signal translating circuit comprising a germanium transistor having base, emitter and collector electrodes, an output circuit connected between said emitter and collector electrodes being adapted to receive a source of energizing potential, said output circuit including an impedance element connected between said emitter electrode and a junction point, means for applying an input signal between said base electrode and said junction point, and means for feeding back signals from said emitter electrode to said base electrode comprising a forward biased silicon diode and an impedance element connected between said emitter electrode and said base electrode.

7. A signal translating circuit comprising a transistor having base, emitter and collector electrodes, an input circuit for applying signals to be translated to said transistor, said input circuit including an impedance element having a first terminal coupled to said base electrode, output circuit means connected between said emitter and collector electrodes being adapted to receive a source of energizing potential including a resistor connected between said emitter electrode and a point of reference potential for said circuit so that at least a portion of the signals translated by said transistor is developed across said resistor, a diode of a type having an intrinsic voltage due to diffusion currents in the diode junction which is greater than the intrinsic voltage of the emitter-base junction of said transistor, having one electrode connected to the junction of said emitter electrode and said resistor and the other electrode connected to a second terminal of said input impedance element, whereby translated signals appear across said diode, and biasing means including a voltage divider connected to the second terminal of said input impedance element to bias said diode in the forward direction to a point beyond the knee of the current versus voltage characteristic thereof to exhibit a relatively high direct current resistance and a relatively low alternating current resistance to said last mentioned translated signals.

8. A signal translating circuit comprising a transistor having base, emitter and collector electrodes, an input circuit for applying signals to be translated to said transistor, said input circuit including an impedance element having a first terminal coupled to said base electrode, output circuit means connected between said emitter and collector electrodes being adapted to receive a source of energizing potential including a second impedance element connected between said emitter electrode and a point of reference potential for said circuit so that at least a portion of the signals translated by said transistor is developed across said second impedance element, a biasing circuit for said transistor, said biasing circuit including a diode having one electrode connected to the junction of said emitter electrode and said second impedance element and the other electrode connected to a second terminal of said input impedance element, whereby translated signals are developed across said diode, and means to so bias said diode in a forward direction that said diode exhibits low impedance to the translated signal appearing across said diode both for increasing and decreasing components of said signal, said diode having an intrinsic voltage thereacross due to diffusion currents in the diode junction which is greater than the intrinsic voltage of the emitter-base junction of said transistor.

9. A signal translating circuit comprising a transistor having base, emitter and collector electrodes, an input circuit coupled to said base electrode, an output circuit means connected between said emitter and collector-electrode being adapted to receive a source of energizing potential, said output circuit including means for developing at said emitter electrode a signal which is in phase with the signal applied to said base electrode, and direct current conductive means connecting said emitter to said base electrode, whereby a signal appears across said direct current conductive means, said direct current conductive means including an impedance element in series with a diode biased in a forward direction to a point where said diode exhibits low alternating current impedance both for increasing and decreasing components of said signal appearing thereacross, said diode having an intrinsic voltage thereacross due to diffusion currents in the diode junction which is greater than the intrinsic voltage of the emitter-base junction of said transistor.

References Cited in the file of this patent

UNITED STATES PATENTS 2,878,380 Holmes ---------------- Mar. 17, 1959

OTHER REFERENCES

Hurley: Junction Transistor Electronics, Wiley & Sons, New York, 1958, pp. 22–27, TK7872, T73, H86.